(12) United States Patent
Raychaudhuri et al.

(10) Patent No.: US 6,551,725 B2
(45) Date of Patent: Apr. 22, 2003

(54) INORGANIC BUFFER STRUCTURE FOR ORGANIC LIGHT-EMITTING DIODE DEVICES

(75) Inventors: Pranab K. Raychaudhuri, Rochester, NY (US); Joseph K. Madathil, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 103 days.

(21) Appl. No.: 09/795,265

(22) Filed: Feb. 28, 2001

(65) Prior Publication Data

US 2002/0185969 A1 Dec. 12, 2002

(51) Int. Cl.[7] .................. H05B 33/26; H05B 33/22; C09K 11/00
(52) U.S. Cl. .............. 428/690; 428/917; 313/502; 313/504; 313/506; 427/66
(58) Field of Search .................. 428/690, 917; 313/502, 506, 504; 427/66

(56) References Cited

U.S. PATENT DOCUMENTS

| 4,720,432 A | 1/1988 | VanSlyke et al. ........... 428/457 |
| 4,769,292 A | 9/1988 | Tang et al. ................. 428/690 |
| 4,885,211 A | 12/1989 | Tang et al. ................. 428/457 |
| 5,073,446 A | * 12/1991 | Scozzafava et al. ........ 428/323 |
| 5,645,948 A | 7/1997 | Shi et al. ................... 428/690 |
| 5,935,721 A | 8/1999 | Shi et al. ................... 428/690 |
| 6,020,078 A | 2/2000 | Chen et al. ................. 313/504 |
| 6,278,236 B1 | * 8/2001 | Madathil et al. ............ 313/504 |
| 2002/0074935 A1 | * 6/2002 | Kwong et al. ............... 313/504 |

FOREIGN PATENT DOCUMENTS

| DE | 19807370 | 7/1999 |
| EP | 0876086 | 11/1998 |
| EP | 0880305 | 11/1998 |
| EP | 0880307 | 11/1998 |
| EP | 0982783 | 3/2000 |

* cited by examiner

Primary Examiner—Cynthia H. Kelly
Assistant Examiner—Dawn Garrett
(74) Attorney, Agent, or Firm—Raymond L. Owens

(57) ABSTRACT

An OLED device, including a substrate, an anode formed of a conductive material over the substrate, an emissive layer having an electroluminescent material provided over the anode layer, a buffer structure including at least two layers, a first buffer layer provided over the electron-transport layer and containing an alkaline halide and a second buffer layer provided over the first buffer layer and containing a metal or metal alloy and having a work function of between 2.0 to 4.0 eV; and a sputtered layer of a metal or metal alloy provided over the buffer structure.

22 Claims, 1 Drawing Sheet

INORGANIC BUFFER STRUCTURE FOR ORGANIC LIGHT-EMITTING DIODE DEVICES

CROSS REFERENCE TO RELATED APPLICATION

Reference is made to commonly-assigned U.S. patent application Ser. No. 09/636,494 filed Aug. 11, 2000, pending, entitled "Improved Cathode Layer in Organic Light-Emitting Diode Devices" by Raychaudhuri et al, the disclosure of which is incorporated herein.

FIELD OF THE INVENTION

The present invention relates to organic light-emitting diode devices and methods for making such devices, which use an inorganic buffer structure and a sputtered metal or metal alloy layer on such inorganic buffer structure.

BACKGROUND OF THE INVENTION

Organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and viewable from oblique angles. These unique attributes are derived from a basic OLED structure comprising of a multilayer stack of thin films of small-molecule organic materials sandwiched between an anode and a cathode. Tang et al in commonly-assigned U.S. Pat. Nos. 4,769,292 and 4,885,211 have disclosed such a structure. The common electroluminescent (EL) medium is comprised of a bilayer structure of a hole-transport (HTL) layer and an electron-transport layer (ETL), typically of the order of a few tens of nanometer (nm) thick for each layer. The anode material is usually an optically transparent indium tin oxide (ITO) film on glass, which also serves as the substrate for the OLED. The cathode is typically a reflective thin film. Selection of electrode materials is based on work functions. ITO is most commonly used as the anode because it has a high work function. Mg:Ag alloys are generally used as electron-injecting contacts because they have lower work functions. Lithium containing alloys such as Al:Li, Ag:Li and LiF/Al contacts also provide efficient electron injection. The device emits visible light in response to a potential difference applied across the EL medium. When an electrical potential difference is applied at the electrodes the injected carriers—hole at the anode and electron at the cathode—migrate towards each other through EL medium and a fraction of them recombine to emit light.

In the fabrication of OLED vapor deposition method is used. Using this method, the organic layers are deposited in thin-film form onto the ITO glass substrates in a vacuum chamber, followed by the deposition of the cathode layer. Among the deposition methods for the cathode, vacuum deposition using resistive heating or electron-beam heating has been found to be most suitable because it does not cause damage to the organic layers. However, it would be highly desirable to avoid these methods for fabrication of the cathode layer. This is because they are inefficient processes. In order to realize low-cost manufacturing one must adopt and develop a proven robust high-throughput process specific to OLED fabrication. Sputtering has been used as a method of choice for thin film deposition in many industries. Conformal, dense, and adherent coatings, short cycle time, low maintenance of coating chamber, efficient use of materials are among few of the benefits of sputtering.

The fabrication of the OLED cathode layer employing high-energy deposition process such as sputtering is not commonly practiced because of the potential damage inflicted on the organic layers, and thus degradation of the OLED performance. Sputter deposition takes place in a complex environment that comprises of energetic neutrals, electrons, positive and negative ions and emissions from the excited states that can degrade the organic layers upon which the cathode is deposited.

Liao et al (Appl. Phys. Lett. 75,1619 [1999]) investigated using x-ray and ultraviolet photoelectron spectroscopies the damages induced on Alq surfaces by 100 eV Ar+ irradiation. It is revealed from core level electron density curves that some N—Al and C—O—Al bonds in Alq molecules were broken. The valance band structure is also tremendously changed implying the formation of a metal-like conducting surface. It is suggested that this would cause nonradiative quenching in OLEDs when electrons are injected into the Alq layer from the cathode and also would results in electrical shorts.

During sputter deposition of cathode the Alq surface is subjected to high doses of $Ar^+$ bombardments at several hundred volts. As shown by Hung et al (J. Appl. Phys. 86, 4607 [1999]) that a dose only of $9 \times 10^{14}/cm^2$ altered the valance band structure. However, sputtering a cathode on Alq surface in Ar atmosphere would degrade the device performance.

Sputtering damage is somewhat controllable, at least to some extent, by properly selecting the deposition parameters. In the European patent applications EP 0 876 086 A2, EP 0 880 305 A1, and EP 0 880 307 A2, Nakaya et al. of TDK Corporation disclose a method of depositing a cathode by a sputtering technique. After depositing all organic layers, with vacuum still kept, the devices was transferred from the evaporation to a sputtering system wherein the cathode layer was deposited directly on the emission layer. The cathode was an Al alloy comprised of 0.1–20 a % Li that additionally contained at least one of Cu, Mg and Zr in small amounts and in some cases had a protective overcoat. The OLED devices thus prepared using no buffer layer were claimed to have good adhesion at the organic layer/electrode interface, low drive voltage, high efficiency and exhibited a slower rate of development of dark spot. Grothe et al. in patent application DE 198 07 370 C1 also disclose a sputtered cathode of an Al:Li alloy which had relatively high Li content and having one or more additional elements chosen from Mn, Pb, Pd, Si, Sn, Zn, Zr, Cu and SiC. In all of those examples no buffer was used, yet electroluminescent was produced at lower voltage. Some sputtering damage was possibly controlled by employing a low deposition rate. It is easily anticipated that by lowering sputtering power the damage inflicted on the organic layers can be reduced. At low power, however, the deposition rate can be impracticably low and the advantages of sputtering are reduced or even neutralized.

To minimize damage during high speed sputtering of cathodes a protective coating on the electron-transport layer can be useful. The protective layer, alternately termed as the buffer layer, must be robust to be effective. However, in addition to being resistant to plasma, the buffer layer must not interfere with the operation of the device and must preserve the device performance. Parthasarathy et al (J. Appl. Phys. 72, 2138 [1998]) reported an application of a buffer layer consisting of copper phthalocyanine (CuPc) and zinc phthalocyanine (ZnPc) during sputtering deposition of a metal free cathode. The buffer layer prevented damage to the underlying organic layers during the sputtering process.

Hung et al (J. Appl. Phys. 86, 4607 [1999]) disclosed the application of CuPc buffer layers that permitted high-energy deposition of a cathode. The cathode contained a dopant, e.g. Li, which was believed to diffuse through the buffer layer and provided an electron injecting layer between the organic light emitting structure and the buffer layer. In the patent application EP 0 982 783 A2 Nakaya et al. disclose a cathode of Al:Li alloy. The cathode was prepared by sputtering using a buffer layer constructed of a porphyrin or napthacene compound that was deposed between the emission and the cathode. The device containing the sputtered electrode exhibited low drive voltage, high efficiency and retarted dark spot growth. Although it was claimed in all those references that efficient devices were made, none were said to have eliminated the sputter damage.

The shortcomings of prior art device structures are that they are not ideally suited for devices that contain dopants emitting in different colors. While CuPc is largely transparent in the green region of the wavelength, the transparency in red and blue wavelength length regions is substantially lower. To be useful in full color devices the buffer should have uniformity of transparency in a greater range of wavelength. Another undesirable feature is that the phthalocyanine layer must be about 20 nm thick requiring long deposition time.

SUMMARY OF THE INVENTION

It is therefore an object of the present invention to provide an OLED device structure, which has relatively uniform transparency in the visible wavelength range and that, offers significant protection against damage during sputtering deposition of electrode.

The above object was achieved in an OLED device, comprising:
a) a substrate;
b) an anode formed of a conductive material over the substrate;
c) an emissive layer having an electroluminescent material provided over the anode layer;
d) a buffer structure including at least two layers, a first buffer layer provided over the electron-transport layer and containing an alkaline halide and a second buffer layer provided over the first buffer layer and containing a metal or metal alloy and having a work function of between 2.0 to 4.0 eV; and
e) a sputtered layer of a metal or metal alloy provided over the buffer structure.

An advantage of the present invention is that damage to the organic layers during sputtering deposition of cathodes is minimized. The present invention permits high sputtering rates and is suitable for full color large-area devices and displays.

The buffer structure in accordance with the invention having two buffer layers exhibited substantially superior performance in comparison to that of devices having only the metal/metal alloy buffer layer but otherwise identical in structure.

The buffer structure is very thin and has relatively uniform transparency in the visible wavelength range and that offers significant protection against damage during sputtering deposition of cathodes Another advantage of the present invention is that OLED devices produced by the sputtering deposition method are efficient and operable with a low drive voltage.

DETAILED DESCRIPTION OF THE INVENTION

Figure 1:
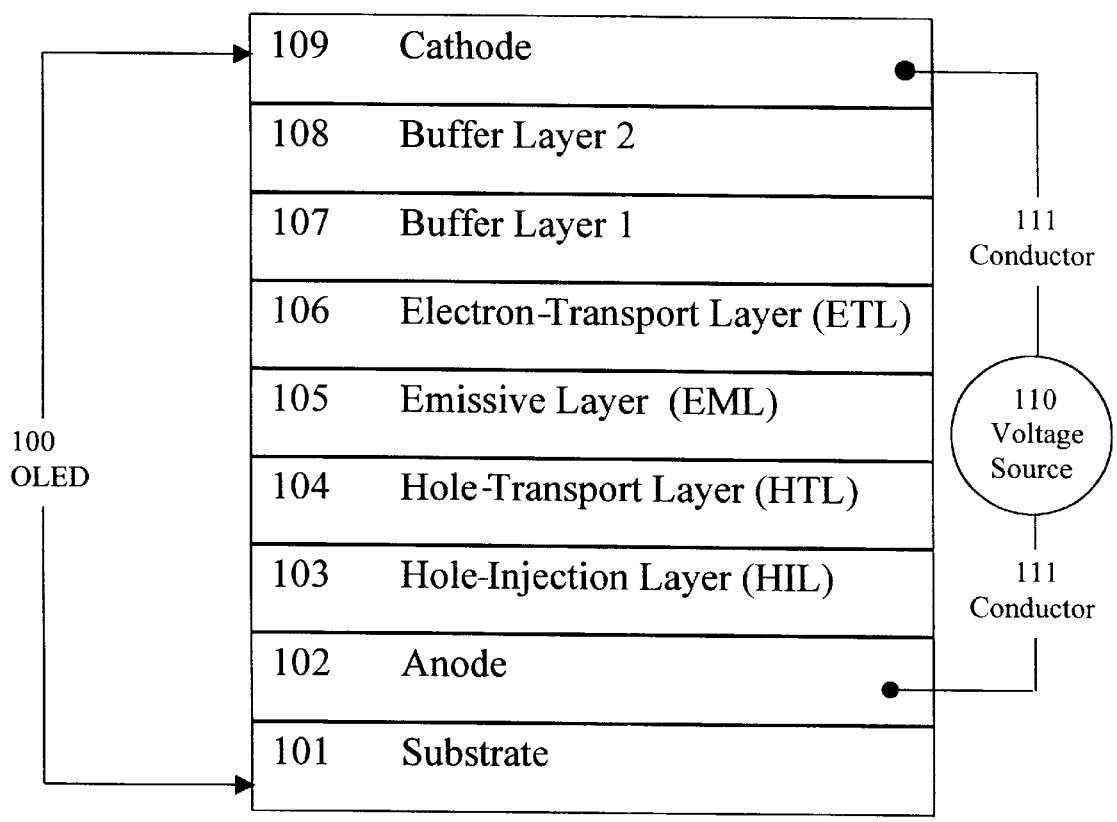
FIG. 1 shows schematically the layer structure of the OLED device.

Throughout the ensuring description acronyms are used to designate the names of different layers and operating features of organic light-emitting diode devices. For reference, they are listed in Table 1.

TABLE 1

| | |
|---|---|
| OLED | Organic light-emitting diode |
| ITO | Indium tin oxide |
| HIL | Hole-injection layer |
| HTL | Hole-transport layer |
| EML | Emissive layer |
| ETL | Electron- transport layer |
| NPB | 4,4'-Bis[N-(1-naphthyl)-N-phenylamino]biphenyl (NPB) |
| Alq | Tris(8-hydroxyquinoline) aluminum |
| LiF | Lithium Fluoride |
| Y | Yttrium |
| Mn | Manganese |
| Mg:Ag | Magnesium silver alloy |
| Al | Aluminum |
| Ag | Silver |

Turning now to FIG. 1, the OLED device 100 of this invention comprises a substrate 101, an anode 102, a hole-injection layer (HIL) 103, a hole-transport layer (HTL) 104, an emissive layer (EML) 105, an electron-transport layer (ETL) 106, two buffer layers 107 and 108, and a cathode 109. In operation, the anode and the cathode are connected to a voltage source 110 via conductors 111 and electrical current is passed through the organic layers, resulting in light emission or electroluminescence from the OLED device. Depending on the optical transparency of the anode and cathode, electroluminescence can be viewed from either the anode side or the cathode side. The intensity of the electroluminescence is dependent on the magnitude of the electrical current that is passed through the OLED device, which in term is dependent on the luminescent and electrical characteristics of the organic layers as well as the charge-injecting nature of the anode 102 and cathode 109.

The composition and the function of the various layers constituting the OLED device are described as follows:

Substrate 101 may include glass, ceramic, or plastics. Since the OLED device fabrication does not require high temperature process, any substrate that can withstand process temperatures of the order of 100° C. is useful, which includes most thermal plastics. The substrate may take the form of rigid plate, flexible sheet, or curved surfaces. Substrate 101 may include support with electronic backplane, and thus includes active-matrix substrates, which contain electronic addressing and switching elements. Examples of such active-matrix substrates include single-crystal silicon wafer with CMOS circuit elements, substrates with high-temperature polysilicon thin-film-transistors, substrates with low-temperature polysilicon thin-film transistors. Those skilled in the art will appreciate that other circuit elements can be used to address and drive the OLED devices.

Anode 102 provides the function of injecting hole into the organic layer when a positive potential relative to the cathode is applied to the OLED. It has been shown, for example in commonly-assigned U.S. Pat. No. 4,720,432, that indium tin oxide (ITO) forms efficient anode because it has a relatively high work function. Since ITO film itself is transparent, ITO coated glass provides an excellent support for the fabrication of OLED devices. Other suitable anode materials include high work function metals such as Au, Pt, Pd, or alloys of these metals.

Hole-injection layer (HIL) 103 provides the function of increasing the efficiency of the hole-injection from the anode 102 into the organic layers. It has been shown, for example in commonly-assigned U.S. Pat. No. 4,885,211, that a porphorinic or phthalocyanine compound is useful as a hole injection layer 103, resulting in increased luminance efficiency and operational stability. Other preferred HIL materials include CFx, which is a fluorinated polymer deposited by plasma-assisted vapor deposition, wherein x is less than or equal to 2 and greater than 0. The method of preparation and the characteristics of CFx have been disclosed in commonly assigned U.S. patent application Ser. No. 09/186,538, filed Nov. 5, 1998, entitled "Organic Electroluminescent Device With a Non-Conductive Fluorocarbon Polymer" by Hung et al, the disclosure of which is incorporated herein.

Hole-transport layer (HTL) 104 provides the function of transporting holes to the emissive layer (EML) 105. HTL materials include various classes of aromatic amines as disclosed in commonly-assigned U.S. Pat. No. 4,720,432. A preferred class of HTL materials includes the tetraaryldiamines of formula (I).

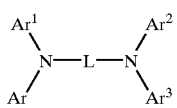

wherein:

Ar, $Ar^1$, $Ar^2$ and $Ar^3$ are independently selected from among phenyl, biphenyl and naphthyl moieties;

L is a divalent naphthylene moiety or $d_n$;

d is a phenylene moiety;

n is an integer of from 1 to 4; and at least one of Ar, $Ar^1$, $Ar^2$ and $Ar^3$ is a naphthyl moiety.

Useful selected (fused aromatic ring containing) aromatic tertiary amines are the following:

4,4'-Bis[N-(1-naphthyl)-N-phenylamino]biphenyl (NPB)
4,4''-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene Emissive layer 105 of FIG. 1 provides the function of light emission produced as a result of recombination of holes and electrons in this layer. A preferred embodiment of the emissive layer comprises of a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly-assigned U.S. Pat. No. 4,769,292 has described this dopant scheme in considerable details for OLED devices using Alq as the host material. As set forth in the Tang et al. commonly-assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; alkyl substituted 9,10 dinaphthyl anthracene, as disclosed in Shi et al. commonly-assigned U.S. Pat. No. 5,935,721.

Dopant materials include most fluorescent and phorphorescent dyes and pigments. Preferred dopant materials include coumarins such as Coumarin 6, dicyanomethylenepyrans such as 4-dicyanomethylene-4H pyrans, as disclosed in Tang et al. commonly-assigned U.S. Pat. No. 4,769,292 and in Chen et al. in commonly-assigned U.S. Pat. No. 6,020,078.

Electron-transport layer 106 of FIG. 1 provides the function of delivering electrons injected from the cathode to the emissive layer 105. Useful materials include Alq, benzazoles, as disclosed in commonly-assigned Shi et al. commonly-assigned U.S. Pat. No. 5,645,948.

Buffer layer 1 (107) and buffer layer 2 (108) of FIG. 1 provide the function of controlling the sputter damage during the deposition of the cathode and thereby preserve or enhance the performance of the OLED device. It has been found that both buffer layers are necessary in order to minimize the sputter damage. Buffer layer 1, which is adjacent to the electron-transport layer, includes materials belonging to the alkaline halide group. Preferred materials include LiF, NaCl, KI, CsF, and CsI. These materials are sublimable and can be deposited in a thin film form using conventional vapor deposition methods. Since they are electrical insulators, the useful range of thickness for buffer layer 1 using these materials should be no greater than 10 nm. The preferred range of thickness is less than 3 nm and greater than 0.1 nm.

Buffer layer 2 (108) of FIG. 1 includes yttrium and manganese. Other useful materials include gallium, indium, lead, scandium, titanium, zirconium, hafnium, niobium, alkaline metals, alkaline earth metals and rare earth metals whose work functions are between 2.0 eV to 4.0 eV. Some of these materials can be deposited in a thin-film form using conventional vapor deposition methods; others have low vapor pressures requiring electron beam deposition. It will be shown in the examples of this invention, that in absence of buffer layer 1, buffer layer 2 is considerably less effective in reducing sputter damage, resulting in OLED devices with lower luminance efficiency and higher drive voltage. The provision of both buffer layer 1 and buffer layer 2 is required in accordance with the invention to minimize cathode sputter damage. The advantageous results from using these two layers are indeed quite unexpected. The buffer layer 1 is disposed adjacent to the electron-transport layer and the buffer layer 2 is disposed over buffer layer 1. The thickness of the buffer layer 2 should be in a range of less than 20 nm but greater than 0 nm. The preferred thickness for the buffer layer 2 is less than 10 nm but greater than 0 nm. The thickness of a bilayer buffer structure should be greater than 0 nm and less than 30 nm. The buffer structure thickness more preferably be greater 0 but less than 5 nm. The layer (109) of FIG. 1 provides increased conductivity and reflectivity of the electron-injecting layer of the device. Sputter deposition is preferred because it is a robust thin-film deposition process.

The sputtering apparatus was equipped with a 2-inch diameter DC sputter gun and a 1 kW DC power supply. A target of pure Ag was used in these investigations although other metal and alloy targets can also be used. The target-to-substrate distance was 3 inch. The chamber was evacuated to less than $1 \times 10^{-6}$ Torr and backfilled with pure Ar to maintain a fixed pressure, typically 16 mT (milli-Torr). The sputtering power applied to the Ag target was 75 W, resulting in a film deposition rate of about 1.5 nm/s. The deposition parameters such as power and deposition time were varied in this investigation to produce the desired film thickness. Although sputtering from a single target was used, simultaneous sputtering of multiple targets can be employed for increased process throughput. RF, Instead of DC, can be used as an alternate power source. It is conceived that instead of a metal layer an alloy layer with improved properties can be utilized. It is also understood that cosputtering of several targets instead of a single alloy target can be employed for adjusting the composition of the alloy layer.

Although the FIG. 1 embodiment is believed preferred, it will be appreciated by those skilled in the art that a device can also be made which does not use hole-injection layer 103, hole-transport layer 104 and electron-transport layer 106. Those skilled in the art will appreciate that the emissive layer can be selected to include hole-transport and electron-transport functions and the anode layer can function as the hole-injection layer. In such an instance, the device requires 105 and does not require layers 103, 104, and 106.

EXAMPLES

In the following examples, reference should be made to Table 1 for the appropriate structure and operating parameters corresponding to the listed acronym. In these tables eV (volt) refers to the voltage required to pass 20 mA/cm$^2$ through the device, and L (cd/m$^2$) refers to the luminance of the OLED device under this condition. Moreover, Tables, 2 and 3, which follow, will be referenced in the following examples.

Example 1

In Table 2 compiled are the device structures and performances of devices including a device of the present invention and a control device. The ITO, HIL, HTL and EML/ETL of devices 100, 101, 102 and 103 are identical, and the organic layers, HIL and EML/ETL, were deposited in a single pump-down run. The device 100 has no buffer layer; Ag layer, 60 nm thick was directly sputtered on the Alq ETL layer. This device exhibits severely degraded performance, as evidenced by its unusually high operating voltage and extremely low efficiency. The degradation is likely due to damage induced during sputtering and may also because of high work function of Ag (Ag work function ~4.4 eV). The control device, 103, which was provided with a standard cathode consisting of a 60 nm thick electron beam evaporated Al layer on a 0.5 nm LiF layer exhibits a luminance efficiency of 2.4 cd/A and an operating voltage of 5.4 volt. The device 101 was provided with an electron beam evaporated 1.5 nm thick Y metal buffer (work function ~3.4 eV) layer upon which a 60 nm thick Ag layer was sputtered under the same conditions as for the device 100. The device 101 shows an efficiency of 1.8 cd/A and an operating voltage of 6.9 eV indicating markedly improved performances over those of the device 100. The performance of the device 101, however, falls short of that of the control device 103. In structure of the device 102 incorporated is a bilayer buffer structure comprising a 1.5 nm Y layer on a 0.5 nm LiF layer. The bilayer buffer structure in the device 102 has resulted in an improvement amounting to 36% in efficiency and 0.8 eV in operating voltage over those of the device 101 that has

TABLE 2

Structure, Layer Thickness and Performance of OLED Devices with LiF/Al Standard Cathode and Sputtered Ag Layer on LiF/Y Bilayer Buffer

| Device ID | Anode ITO Thickness (nm) | HIL CFx Thickness (nm) | HTL NPB Thickness (nm) | EML/ETL Alq Thickness (nm) | Buffer 1 LiF Thickness (nm) | Buffer 2 Y Thickness (nm) | Al cathode Thickness (nm) Evaporated | Ag reflector Thickness (nm) Sputtered | Volt | EL(Cd/m2) |
|---|---|---|---|---|---|---|---|---|---|---|
| 100 | 42 | 1 | 75 | 60 | | | | 60 | 10.2 | 1 |
| 101 | 42 | 1 | 75 | 60 | | 1.5 | | 60 | 6.9 | 368 |
| 102 | 42 | 1 | 75 | 60 | 0.5 | 1.5 | | 60 | 6.1 | 499 |
| 103 | 42 | 1 | 75 | 60 | 0.5 | | 60 | | 5.4 | 484 |
| 301 | 42 | 1 | 75 | 60 | | 1.5 | | 60 | 7.2 | 382 |
| 302 | 42 | 1 | 75 | 60 | 0.5 | 1.5 | | 60 | 6.0 | 507 |
| 303 | 42 | 1 | 75 | 60 | 0.5 | | 60 | | 5.6 | 490 |

TABLE 3

Structure, Layer Thickness and Performance of OLED Devices with LiF/Al Standard Cathode and Sputtered Ag Layer on LiF/Mn Bilayer Buffer

| Device ID | Anode ITO Thickness (nm) | HIL CFx Thickness (nm) | HTL NPB Thickness (nm) | EML/ETL Alq Thickness (nm) | Buffer 1 LiF Thickness (nm) | Buffer 2 Mn Thickness (nm) | Al cathode Thickness (nm) Evaporated | Ag reflector Thickness (nm) Sputtered | Volt | EL (Cd/m2) |
|---|---|---|---|---|---|---|---|---|---|---|
| 201 | 42 | 1 | 75 | 60 | | 1.5 | | 60 | 6.8 | 355 |
| 202 | 42 | 1 | 75 | 60 | 0.5 | 1.5 | | 60 | 5.9 | 427 |
| 103 | 42 | 1 | 75 | 60 | 0.5 | | 60 | | 5.4 | 484 |
| 401 | 42 | 1 | 75 | 60 | | 1.5 | | 60 | 6.9 | 383 |
| 402 | 42 | 1 | 75 | 60 | 0.5 | 1.5 | | 60 | 6.2 | 449 |
| 403 | 42 | 1 | 75 | 60 | 0.5 | | 60 | | 5.8 | 499 | only one buffer layer. The device of the present invention, the bilayer buffer device 102, has efficiency of 2.5 cd/A that is identiacal to that of the control device 103. The operating voltage of the bilayer device is slightly higher than that of the control device, but variation in device structure and uncertainty of measurement may account for the discrepancy. Thus, it is believed, that the bilayer buffer has eliminated or greatly reduced the sputtering damage.

Example 2

Table 2 includes the device structures and performances of another set of devices including a device of the present invention and a control device. Again the ITO, HIL, HTL and EML/ETL of devices 301, 302 and 303 are identical, and the organic layers, HIL and EML/ETL, were deposited in a single pump-down run. The control device 303 for this batch was also provided with a standard cathode comprising a 60 nm evaporated Al layer on a 0.5 nm LiF layer. This device exhibits a luminance efficiency of 2.5 cd/A and an operating voltage of 5.6 volt. The device 301 was provided with a 1.5 nm thick Y metal buffer layer upon which a Ag layer, 60 nm thick, was sputtered under the same conditions as for the devices of example 1. The device 301 shows an efficiency of 1.9 cd/A and an operating voltage of 7.2 eV. The performance of the device 301, however, falls short of that of the control device 303. In the structure of device 302 incorporated a bilayer buffer structure comprising a 1.5 nm Y layer on a 0.5 nm LiF layer. The bilayer buffer in the device 302 has resulted in an improvement amounting to 33% in efficiency and 1.2 eV in the operating voltage over the device 301 that has only LiF buffer layer. The device of the present invention, the bilayer buffer device 302 has efficiency 2.5 cd/A that is identical to that of the control device 303. The operating voltage of the bilayer device is 0.4 eV higher than that of the control device, and the discrepancy is most likely due variation in device structure and uncertainty of measurements. Thus, the bilayer buffer has eliminated or greatly reduced the damage during sputtering deposition of the overlayer.

Example 3

Table 3 includes the device structure and performance of a control device along with several devices of the present invention that use a different buffer structure. The HTL and EML/ETL of devices 201, 202, and 103 were again identical, and were deposited in a single pump-down run. The control device 103 was provided with a standard cathode comprising a 60 nm evaporated Al layer on a 0.5 nm LiF layer. This device exhibited luminance efficiency of 2.4 cd/A and an operating voltage of 5.4 volt. The device 201 was provided with a 1.5 nm thick thermally evaporated Mn metal buffer (Mn work function ~3.8 eV) layer upon which a Ag layer, 60 nm thick, was sputtered under the same condition as that for the devices of example 1. The device 201 shows an efficiency of 1.8 cd/A and an operating voltage of 6.8 eV. The performance of the device 201, however, falls short of that of the control device 103. In the structure of device 202 incorporated a buffer structure comprising a 1.5 nm Mn layer on a 0.5 nm LiF layer. The bilayer buffer in the device 202 has resulted in an improvement amounting to 20% in efficiency and 0.9 eV in the operating voltage over the device 201 that has only LiF buffer layer. The device of the present invention, the bilayer buffer device 202, has an efficiency of 2.1 cd/A that is close to that of the control device 103. The operating voltage of the bilayer device is 0.5 eV higher than that of the control device and the discrepancy can be due to variation in device structure and uncertainty of measurement. Thus the bilayer buffer has greatly reduced the damage during sputtering deposition of the overlayer.

Example 4

Table 3 includes the device structures and performances of another set of devices of the present invention and a control device. Again the ITO, HIL, HTL and EML/ETL of devices 401, 402 and 403 are identical, and the organic layers, HIL and EML/ETL, were deposited in a single pump-down run. The control device 403 for this batch was also provided with a standard cathode comprising a 60 nm evaporated Al layer on a 0.5 nm LiF layer. This device exhibits a luminance efficiency of 2.5 cd/A and an operating voltage of 5.8 volt. The device 401 was provided with a 1.5 nm thick Mn metal buffer layer upon which a Ag layer, 60 nm thick, was sputtered under the same conditions as for the devices of example 1. The device 401 shows an efficiency of 1.9 cd/A and an operating voltage of 6.9 eV. The performance of the device 401, however, falls short of that of the control device 403. In the structure of device 402 incorporated a bilayer buffer structure comprising a 1.5 nm Mn layer on a 0.5 nm LiF layer. The bilayer buffer in the device 402 has resulted in an improvement amounting to 33% in efficiency and 0.7 eV in the operating voltage over the device 401 that has only LiF buffer layer. The device of the present invention, the bilayer buffer device 402 has efficiency 2.2 cd/A that is close to that of the control device 403. The operating voltage of the bilayer device is 0.6 eV higher than that of the control device and the discrepancy may be due to difference in device structure and uncertainty of measurements. Thus, the bilayer buffer has eliminated or greatly reduced the damage during sputtering deposition of the overlayer.

Above examples show that an ultrathin single-layer buffer of low work function materials deposited over the Alq electron-transport layer offers some protection for the EL medium against sputtering damage. In accordance with the present invention, a bilayer buffer structure comprising a low work function layer on a LiF layer can be very effective in protecting the organic active layers from damage during sputtering deposition of the overlying electrode. It is noted that an ultrathin buffer structure amounting to only a few nanometers is adequate for virtual elimination of sputter damage. The sputtered electrode device is essentially equal in performance to the evaporated cathode device.

The invention has been described in detail with particular reference to certain preferred embodiments thereof, but it will be understood that variations and modifications can be effected within the spirit and scope of the invention.

PARTS LIST

100 organic light-emitting diode
101 substrate
102 anode
103 hole-injection layer
104 hole-transport layer
105 emissive layer
106 electron-transport layer
107 buffer layer 1
108 buffer layer 2
109 sputtered layer
110 voltage source
111 electrical conductors

What is claimed is:

1. An OLED device, comprising:
   a) a substrate;
   b) an anode formed of a conductive material over the substrate;
   c) an emissive layer having an electroluminescent material provided over the anode layer;
   d) an electron-transport layer provided over the emissive layer;
   e) a buffer structure including at least two layers, a first buffer layer provided over the electron-transport layer and containing an alkaline halide and a second buffer layer provided over the first buffer layer and containing a metal or metal alloy and having a work function of between 2.0 to 4.0 eV; and
   f) a sputtered layer of a metal or metal alloy provided over the buffer structure.

2. An OLED device, comprising:
   a) a substrate;
   b) an anode formed of a conductive material over the substrate;
   c) a hole-injection layer provided over the anode layer;
   d) a hole-transport layer provided over the hole-injection layer;
   e) an emissive layer having an electroluminescent material provided over the hole-transport layer;
   f) an electron-transport layer provided over the emissive layer;
   g) a buffer structure including at least two layers, a first buffer layer provided over the electron-transport layer and containing an alkaline halide and a second buffer layer provided over the first buffer layer and containing a metal or metal alloy and having a work function of between 2.0 to 4.0 eV; and
   h) a sputtered layer of a metal or metal alloy provided over the buffer structure.

3. The OLED device of claim 1 wherein the first buffer layer has a thickness less than 10 nm but greater than 0 nm.

4. The OLED device of claim 1 wherein the first buffer layer has a thickness less than 3 nm but greater than 0.1 nm.

5. The OLED device of claim 1 wherein the second buffer layer has a thickness less than 20 nm but greater than 0 nm.

6. The OLED device of claim 1 wherein the second buffer layer has a thickness less than 10 nm but greater than 0 nm.

7. The OLED device of claim 1 wherein the alkaline halide includes LiF.

8. The OLED device of claim 1 wherein the metal having a work function between 2.0 eV to 4.0 eV includes yttrium, manganese, gallium, indium, lead, scandium, titanium, zirconium, hafnium, niobium, alkaline metals, alkaline earth metals and rare earth metals or metal alloys thereof.

9. The OLED device of claim 1 wherein the sputtered layer includes silver, aluminum, copper and, gold and alloys thereof.

10. The OLED device of claim 1 wherein the electron-transport layer includes Alq.

11. The OLED device of claim 1 wherein the emissive layer contains one or more light emitting doped materials.

12. The OLED device of claim 1 wherein the buffer structure has a thickness of less than 30 nm and greater than 0 nm.

13. The OLED device of claim 12 wherein the buffer structure has a thickness less than 5 nm and greater than 0 nm.

14. A method of making an OLED device, comprising the steps of:
    (a) providing a substrate;
    (b) forming an anode of a conductive material over the substrate;
    (c) depositing an hole-injecting layer over the anode
    (d) an electron-transport layer provided over the emissive layer;
    (e) depositing an emissive layer having an electroluminescent material provided over the hole-injecting layer;
    (f) forming a buffer structure including at least two layers, a first buffer layer provided over the electron-transport layer and containing an alkaline halide and a second buffer layer provided over the first buffer layer and containing a metal or metal alloy and having a work function of between 2.0 to 4.0 eV; and
    (g) sputtering a metal or metal alloy layer provided over the buffer structure.

15. The method of claim 14 wherein the sputtering is accomplished using either DC or RF sputtering.

16. The method of claim 14 wherein the sputtering step is accomplished by sputtering materials from one or more targets.

17. The method of claim 14 wherein the first buffer layer has a thickness less than 10 nm but greater than 0 nm.

18. The method of claim 14 wherein the first buffer layer has a thickness less than 3 nm but greater than 0 nm.

19. The method of claim 14 wherein the second buffer layer has a thickness less than 20 nm but greater than 0 nm.

20. The method of claim 14 wherein the second buffer layer has a thickness less than 10 nm but greater than 0 nm.

21. The method of claim 14 wherein the buffer structure has a thickness of less than 30 nm and greater than 0 nm.

22. The method of claim 14 wherein the buffer structure has a thickness less than 5 nm and greater than 0 nm.

* * * * *